United States Patent

Klug

[11] Patent Number: 5,349,509
[45] Date of Patent: Sep. 20, 1994

[54] INDICATOR ELEMENT

[75] Inventor: Georg Klug, Bad Dürkheim, Fed. Rep. of Germany

[73] Assignee: EBT Licht-Technik GmbH, Bad Durkheim, Fed. Rep. of Germany

[21] Appl. No.: 19,434

[22] Filed: Feb. 18, 1993

[30] Foreign Application Priority Data

Feb. 28, 1992 [DE] Fed. Rep. of Germany ... 9202608[U]

[51] Int. Cl.⁵ ............................................. F21V 17/00
[52] U.S. Cl. .................................. 362/362; 362/310; 362/329; 362/365
[58] Field of Search ............... 362/800, 310, 308, 327, 362/329, 362, 364, 365, 368

[56] References Cited

U.S. PATENT DOCUMENTS

| | | | |
|---|---|---|---|
| 1,099,061 | 6/1914 | Lane | 362/310 |
| 2,192,345 | 3/1940 | Foute | 362/365 |
| 3,276,014 | 9/1966 | Rueger | 340/815.5 |
| 3,440,647 | 4/1969 | Sloan | 362/365 |
| 3,659,093 | 4/1972 | Rieth | 362/366 |
| 3,887,803 | 6/1975 | Savage, Jr. . | |
| 4,358,708 | 11/1982 | Silva et al. | 315/58 |
| 4,712,163 | 12/1987 | Oxley | 362/310 |
| 4,727,289 | 2/1988 | Uchida . | |
| 4,829,407 | 5/1989 | Bushell et al. | 362/800 |
| 4,967,330 | 10/1990 | Bell et al. . | |

FOREIGN PATENT DOCUMENTS

| | | | |
|---|---|---|---|
| 63379 | 12/1963 | Belgium | 362/362 |
| 533925 | 12/1956 | Canada | 362/368 |
| 107480 | 5/1984 | European Pat. Off. . | |
| 569873 | 2/1933 | Fed. Rep. of Germany . | |
| 577906 | 6/1933 | Fed. Rep. of Germany . | |
| 2019797 | 1/1971 | Fed. Rep. of Germany . | |
| 8208396.7 | 1/1986 | Fed. Rep. of Germany . | |
| 3069436 | 3/1986 | Fed. Rep. of Germany . | |
| 3511839 | 10/1986 | Fed. Rep. of Germany . | |
| 8424611.1 | 8/1989 | Fed. Rep. of Germany . | |
| 500471 | 11/1954 | Italy . | |
| 661607 | 7/1987 | Switzerland . | |
| 1372028 | 10/1974 | United Kingdom . | |
| 2161024 | 1/1986 | United Kingdom | 362/202 |

OTHER PUBLICATIONS

Information 161, Super-bright LED-Indicator in Three Colors, *Elektronik Information*, Nr.3-1981.

*Primary Examiner*—Ira S. Lazarus
*Assistant Examiner*—L. Heyman
*Attorney, Agent, or Firm*—Evenson, McKeown, Edwards & Lenahan

[57] ABSTRACT

An indicator element comprising a light permeable cap (6) having a light source (26, 50) at least partially disposed therein, and a protective sleeve (32) with connecting conductors (54, 55) for the light source (26, 50) disposed in the interior thereof, the cap (6) and the protective sleeve (32) being at least partially surrounded by and fastened in a sleeve (2) in such a way that with a compact construction, a reliably operating signal of sufficient brightness is assured and the safety requirements for direct connection to line voltage are satisfied.

15 Claims, 3 Drawing Sheets

INDICATOR ELEMENT

BACKGROUND OF THE INVENTION

This invention relates to an indicator element comprising a light permeable cap in which a light source is at least partially disposed, and a protective sleeve in the interior of which connecting conductors for the light source are arranged.

A indicator element of this type is disclosed in Uchida, U.S. Pat. No. 4,727,289, which contains light emitting diodes (LEDs) as the light source. The LEDs are disposed on a printed circuit and are located inside a light permeable cap which takes the form of a glass bulb joined to a base of metal. This base serves as a protective sleeve for the electrical conductor disposed inside of it and as a holder for mounting the printed circuit board on stays. A resistor is furthermore disposed in the interior of the base so as to permit direct connection to the line voltage, such as for example 100 volts. The outside dimensions correspond to those of a conventional incandescent lamp with a glass bulb, and miniaturization is not easily possible.

Savage, U.S. Pat. No. 3,887,803 discloses an arrangement with a light emitting diode which is disposed in a cap. The rear end of the cap is engaged in a cylindrical part of a protective sleeve and is joined to the sleeve by snap connections. The connecting conductor as well as a resistor for the LED is disposed in the protective sleeve. Special manufacturing and assembling measures are necessary for fastening the LED to the sleeve. The cap is joined only by a snap connection to the expanded front part of the sleeve and can be pulled forward out of the sleeve, so that in practice damage or even destruction of the LED is always possible.

Indicator elements with incandescent lamps, glow discharge lamps and light emitting diodes may have an all-plastic body, or also a threaded metal base, for mounting in a switchboard, panel or the like. Furthermore, such indicator elements contain insulators and contacts for electrical connection. Due to their physical construction, small indicator elements with incandescent lamps and light emitting diodes cannot be operated directly on line voltages of 110 to 250 volts AC so as to provide enough brightness to reliably indicate the states of "on" and "off." A reliable signal function can be achieved up to a voltage of 60 volts AC or DC. This does not apply to indicator elements with glow discharge lamps which because of their particular characteristics are used for the above-mentioned line voltages.

SUMMARY OF THE INVENTION

It is the object of the invention to provide an indicator element of the type described which produces a reliably operating signal of sufficient brightness in a compact construction.

Another object of the invention is to provide an indicator element constructed with LEDs which can be used directly with line voltages of 110 volts AC to 250 volts AC.

A further object of the invention is to provide an indicator element constructed in such a way that with basic components of largely the same construction, either an LED, a multiple LED with four or more LED chips, a glow discharge lamp or comparable lights can be installed in it.

It is also an object of the invention to provide an indicator element which reliably protects against contact, and which satisfies safety requirements.

An additional object of the invention is to provide an indicator element which permits components such as resistors or diodes to be electrically connected in front of it.

Yet another object of the invention is to provide an indicator element which has a low cost of manufacture and is easy to install.

These and other objects of the invention are achieved by providing an indicator element comprising a light permeable cap, a light source arranged to direct light through the cap, a protective sleeve abutting the cap through which connecting conductors for the light source extend, and an outer sleeve at least partially surrounding the cap and the protective sleeve, with the cap and the protective sleeve being fastened in the outer sleeve.

The indicator element constructed in accordance with the invention is characterized by a compact design providing reliable operation. The light source, which is especially in the form of a glow discharge lamp, is fastened, together with a lens and/or cap as well as a sleeve to prevent contact, in a second sleeve, which is referred to hereinafter as the outer or threaded sleeve. This additional sleeve is advantageously made of metal and is preferably provided with an external screw thread. Even if the light source is constructed with LEDs, it is designed for direct connection to the usual line voltages of 110 volts AC and 250 volts AC. If it is made with a glow discharge lamp, externally it has the construction and appearance of a indicator element containing an LED. The protective sleeve as well as the cap with the lens is made of plastic, the electrical connections, contacts or components connected electrically in front of the indicator being protected against contact within the protective sleeve. No matter what kind of light source is employed, the other components can be used with it, thereby keeping the cost of manufacture and inventories to a minimum. The light source can be inserted directly into the cap, and this applies especially to multiple LEDs of six elements. In this case the outer surface of the light source is directly in contact, with a sliding or press fit, with the inside surface of the cap, and it is thus fixed in the desired axial position. For embodiments of this kind, the outside surface of the light source and the inside surface of the cap are made substantially cylindrical in shape.

For larger embodiments, the light source can be inserted into an annular fitting and fastened, if necessary, by welding, cementing or the like. The annular fitting may advantageously have an inside surface in the form of a reflector which surrounds the light source, whether it be a multiple LED or a glow discharge lamp, and which reflects the emitted light forward toward a lens. Like the annular fitting, the cap with the lens has a radial flange which can be brought into contact with an abutment surface on the outer sleeve. The protective sleeve, whose open end is likewise inserted into the outer sleeve and, especially, pressed into it, reliably assures protection against contact. The existing color spectrum of the LEDs consists of the monochromatic colors, red-orange-yellow and green. By using glow discharge lamps intense colors are obtained in the green and blue range. Furthermore, the glow discharge lamps have price advantages, and, in the proposed indicator element form, they have the appearance of a modern LED indicator.

Advantageous embodiments and further special features of the invention are described below.

BRIEF DESCRIPTION OF THE DRAWINGS

The invention will be explained in further detail below with reference to preferred embodiments illustrated in the accompanying drawings, in which.

DETAILED DESCRIPTION OF PREFERRED EMBODIMENTS

Figure 1:
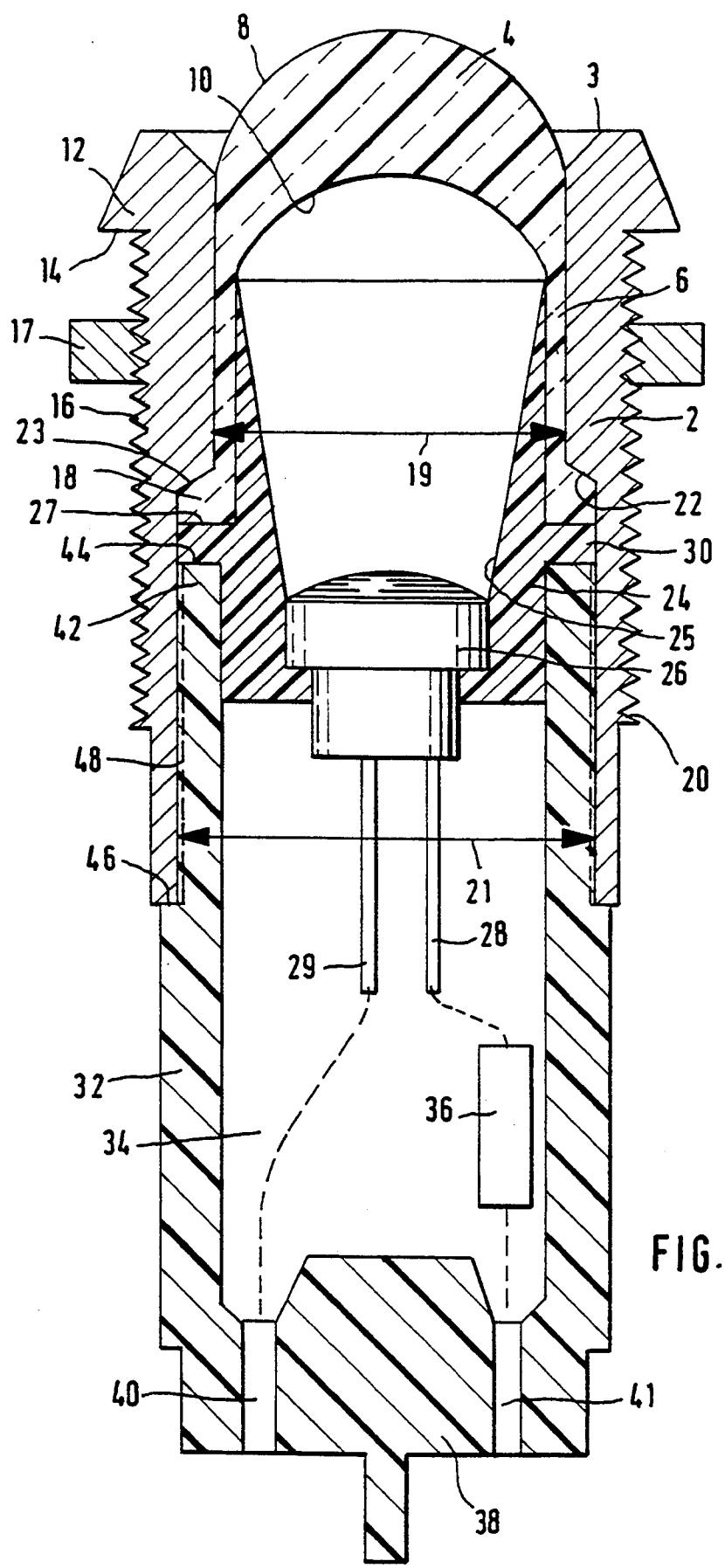
FIG. 1 is an axial longitudinal section through an indicator element with a multiple LED.

FIG. 1 shows in axial longitudinal section a threaded outer sleeve 2, which is made of metal and is configured as a metal reflector. The threaded sleeve 2 has an opening at its front end into which a lens 4 is inserted, which is part of a hollow cylindrical, light permeable cap 6. The cap with the lens 4 is made of light permeable plastic, and the outer front surface 8 and/or the inside surface 10 are roughened to produce a desirable diffusion of the light. The threaded sleeve 2 configured as a metal reflector has on the outside on its front portion a radial projection 12 with a rearwardly facing bearing surface 14 which, after installation in a switchboard or the like, rests against the front surface of the switchboard or panel. Furthermore, the threaded sleeve 2 has an external screw thread 16 which permits it to be tightened by means of a nut 17.

At the rear end of the cap 6 there is a radial flange 18 having an outside diameter which is greater than that of the otherwise cylindrical cap 6. The front end of threaded sleeve 2 has an inside diameter 19, and approximately in the center of the sleeve's length, the inside diameter is expanded to fit the outside diameter of the flange 18, thereby enabling the cap to be inserted through the rear end 20 of the threaded sleeve 2 into the sleeve. The rear portion of threaded sleeve 2 has an inside diameter 21 that is larger than the inside diameter 19 of the front portion. As can be seen from the drawing, the threaded sleeve 2 is provided substantially at its midpoint with a step 22 against which is abutted by the forward bearing surface 23 of the flange 18 of cap 6. Consequently the cap 6 cannot be withdrawn in the forward direction. The sleeve 2, which advantageously is formed of metal, surrounds the cap 6 over a significant part of its total length, while a comparatively small part of the cap protrudes beyond the front end 3 of the sleeve. The cap and the light source 26 disposed within it thus are provided with optimum protection against external influences.

Furthermore, a annular fitting 24 is provided which is configured as a plastic reflector and extends partially into the cavity of the cap 6. The annular fitting 24 has an inside surface which serves as a reflector surface. The annular fitting 24 furthermore serves as a socket and mounting for the light source 26, which in this embodiment takes the form of a sextuple multiple LED. If the light source is supplied with current through its connecting conductors 28 and 29, it emits light forward, which is directed forward by the plastic reflector of the annular fitting 24 and issues as a beam through the lens 4. The annular fitting 24 has a radial flange 30 on its outside surface which abuts against the rear end surface of the cap 6 and its flange 18. Accordingly, the annular fitting 24 together with the previously inserted and fastened light source 26 can be inserted through the rear end 20 of sleeve 2 and brought into the position shown in the drawing.

Finally, the protective sleeve 32 contains an inner chamber 34 to accommodate the conductors 28 and 29 plus any necessary components electrically connected in front of the light source, such as the resistor 36 shown in the drawing. The protective sleeve 32 may be formed of plastic and serves as a guard for the electrical conductors and components which sometimes carry electrical current. The protective sleeve 32 contains a bottom 38 with openings 40 and 41 for conventional electrical contacts, not shown in further detail, by means of which the electrical connection is made. As can be seen from the drawing, the front, open end 42 of the protective sleeve 32 is inserted into the rear end of the threaded sleeve 2 and there partially surrounds the annular fitting 24. The axial end face 44 of the protective sleeve 32 lies against the flange 30 of the annular fitting 24, thereby giving it a defined axial position. The protective sleeve 32 has a small step 46 which abuts the rear end 20 of the threaded sleeve 2. The front end 42 the protective sleeve 32 is tightly inserted into the rear end 20 of the outer threaded sleeve 2. For this purpose the outside surface of the end portion 42 preferably has small, radially protruding portions or ribs 48 indicated by broken lines, which reliably assure a tight press fit. These ribs 48 extending in the axial direction are advantageously given a slightly conical configuration so that they practically vanish in the vicinity of the end face 44 and flare back toward the step 46. The protective sleeve 32 can thus easily be inserted into the end 20 of sleeve 2 and then be pressed into place with greater pressure as its depth of penetration increases.

The annular fitting 24, which is advantageously made of plastic, is disposed partly in the front end of the protective sleeve 32 and partly within the cap 6. The annular fitting 24 overlaps the cap 6 and the protective sleeve 32 in both axial directions. Even if, due to production tolerances, the protective sleeve 32 has not been pressed far enough into the metal threaded sleeve 2, any electrical discharge due to a gap is reliably prevented. In addition, the length of the protective sleeve is advantageously chosen so that the voltage-carrying conductors 28 and 29 are situated at the greatest possible distance from the end face 44 and from any gap that might exist there, so that electrical discharges are reliably prevented.

Figure 2:
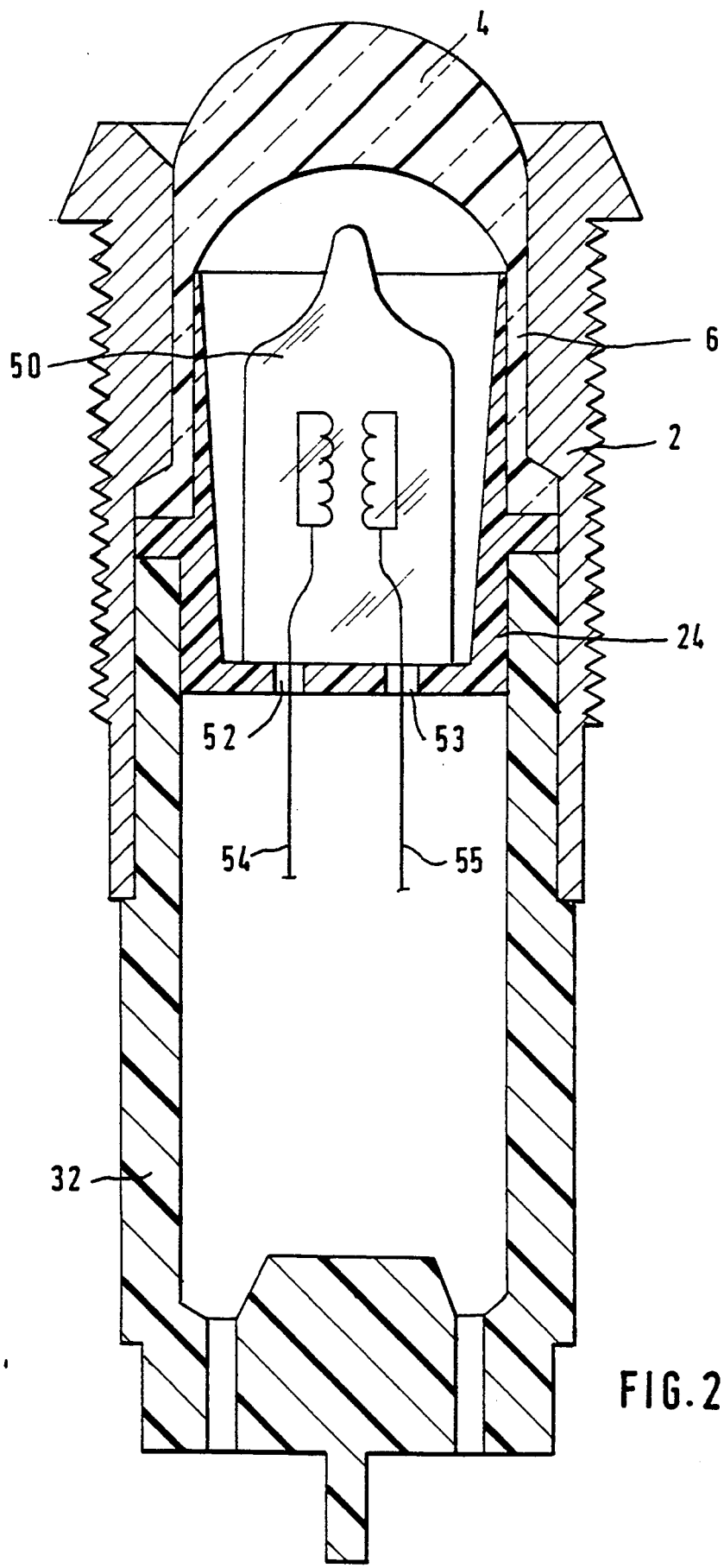
FIG. 2 is a longitudinal section through an indicator element with a glow discharge lamp.

FIG. 2 shows another embodiment of the invention in which the light source is a glow discharge lamp 50. The glow discharge lamp 50 is again disposed in an annular fitting 24 which has in its bottom two openings 52 and 53 for the conductors 54 and 55 of the lamp 50. The annular fitting 24 is essentially the same as in the embodiment shown in FIG. 1 and is likewise in the form of a plastic reflector. As can be seen in the drawing, all the rest the components, namely the threaded sleeve 2, the cap 6 with the lens 4 and the protective sleeve 32, are of the same construction as the embodiment described above, and the description given above can be consulted for information. The indicator element with the glow discharge lamp 50 in accordance with the invention has the same outside dimensions as the indicator element with the multiple LED, and if necessary they are easily interchangeable. Inasmuch as components which are otherwise the same are used, regardless of the specific type of the light source, whether it is a glow discharge lamp or a multiple LED or the like, the costs of manufacture, assembly and installation are reduced to a minimum in an especially desirable manner.

Figure 3:
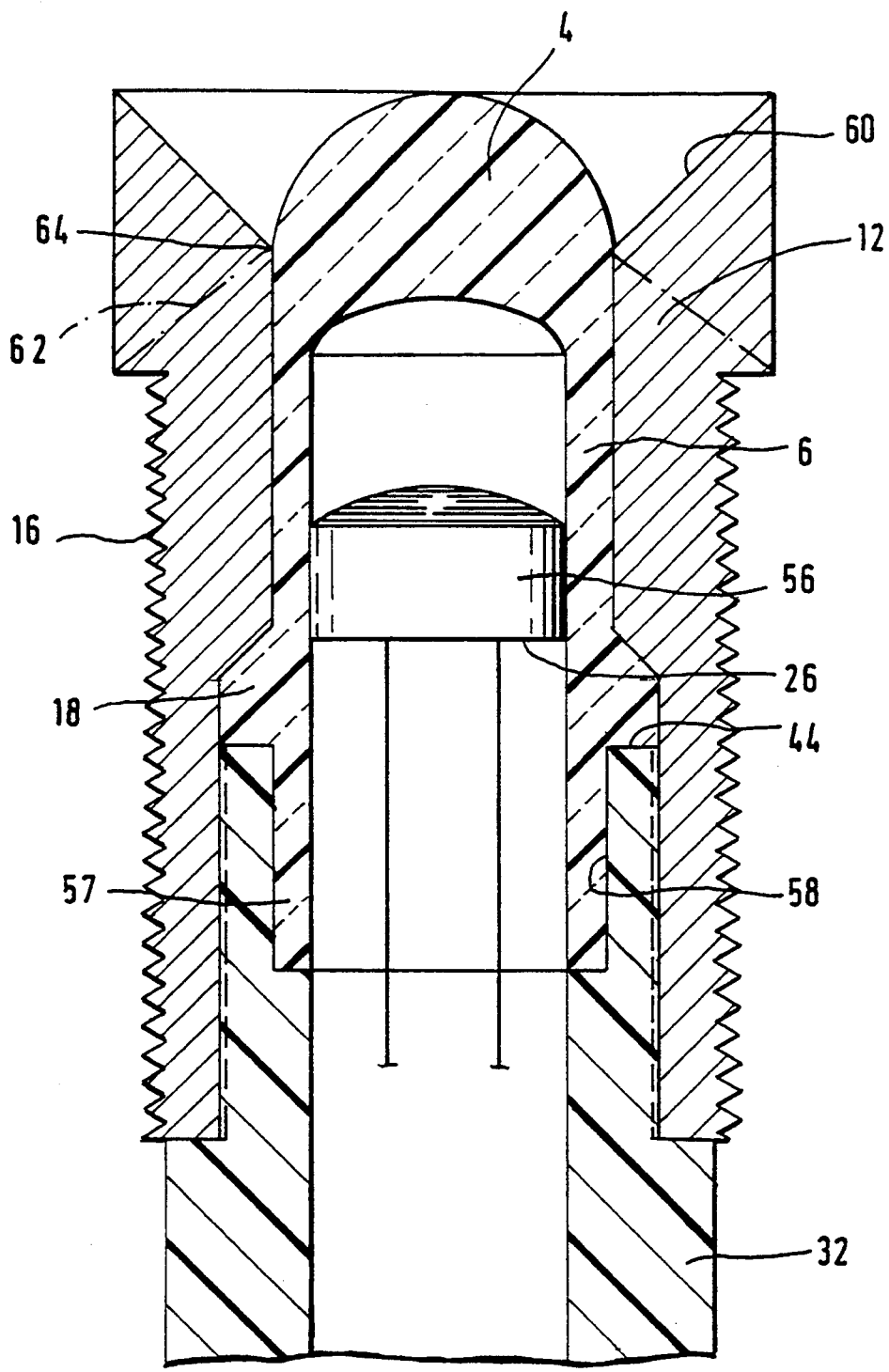
FIG. 3 is a longitudinal section through an indicator element of smaller dimensions.

FIG. 3 shows an embodiment which is of smaller dimensions in comparison with the two indicator elements described above, and which does not contain any annular fitting or plastic reflector. The light source 26 is inserted directly into the cap 6 with the lens 4, and it preferably takes the form of a quadruple LED. The protective sleeve 32 lies with its front end face 44 directly against rear surface of flange 18 of the cap 6. The light source 26 lies with its outside surface 56 snugly against the preferably cylindrical inside surface of the cap 6. In the embodiment shown in FIG. 3, the outside surface 56 of the light source 26 is likewise cylindrically shaped, but bosses, radial projections or the like might be provided on the outside surface 56 to assure a firm contact and stable seating of the light source 26 in the inside surface of the cap 6. The outside diameter of the outside surface 56 or any bosses or the like that may be provided are matched to the inside diameter of the inside surface of cap 6 such that the light source 26 can be inserted from the rear end into the cap 6 with a sliding fit or press fit, but thereafter will lastingly retain the position once assumed. However, a reliable and direct axial fixation of the light source in the light permeable cap 6 can also be made by means of a cement.

The cap 6 furthermore has an annular axial extension 57 which extends into the protective sleeve 32. Extension 57 may suitably be 3 mm in length. The protective sleeve 32 is provided with an annular recess 58 for receiving the extension 57. As a result of this special configuration, any undesired gap between the end face 44 and the flange 18 is avoided, since such a gap might lead in some cases to undesirable electrical discharges between the conductors 28 and 29 and the metal threaded sleeve 2. The protective sleeve 32 and the cap 6 have substantially the same diameter.

In all embodiments, the protective sleeve 32 is tightly inserted into the surrounding outer sleeve 2 which serves as a metal reflector and which also is made as a threaded sleeve with external thread 16, a stable and lasting connection being assured preferably by a press fit. The threaded sleeve 2 contains a reflector surface 60 in the projection 12. This is an internal reflector. An alternative configuration having an external reflector is indicated by the broken line 62. In this configuration, therefore, the lens protrudes partially beyond the front edge 64 of the threaded sleeve 2 and provides good visibility from the side.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations falling within the scope of the appended claims and equivalents thereof.

What is claimed is:

1. An indicator element comprising a light permeable cap (6), a light source (26, 50) arranged to direct light through said cap, a protective sleeve (32) axially arranged with respect to said cap in an inner chamber of which connecting conductors (54, 55) for said light source (26, 50) extend, an outer sleeve (2) at least partially surrounding said cap (6) and said protective sleeve (32), said cap (6) and said protective sleeve (32) being fastened in said outer sleeve (2);

wherein said outer sleeve is provided with an external thread (16) and has a radially outwardly extending, rearwardly facing contact surface (14), said external thread directly adjoining said contact surface.

2. An indicator element comprising:
a light permeable cap (6);
a light source (26, 50) arranged to direct light through said cap;
a protective sleeve axially arranged with respect to said cap in an inner chamber of which connecting conductors (54, 55) for said light source extend;
a fitting in which said light source is mounted, said fitting having a radial flange;
an outer sleeve provided with an annular step in the interior thereof a surface of which is directed radially outward, said outer sleeve substantially surrounding said cap and at least partially surrounding said protective sleeve;
wherein said radial flange of said fitting is axially fastened between said annular step and an axial front end face of said protective sleeve; and
wherein an annular contact surface having an axial length is provided between said fitting and an interior surface of said protective sleeve, said annular contact surface extending along its axial length between said inner chamber and said axial front end face of said protective sleeve.

3. An indicator element according to claim 2, wherein the light source is at least partially disposed in said cap.

4. An indicator element according to claim 2, wherein said outer sleeve (2) is configured as a reflector.

5. An indicator element according to claim 2, wherein said outer sleeve (2) is substantially cylindrical having front and rear ends both of which are open, the rear end having an inside diameter (21) which is enlarged compared to the front end diameter (19).

6. An indicator element according to claim 5, wherein said cap (6) is provided with a forwardly facing contact surface which abuts said step when said cap is inserted into said sleeve through the rear end thereof, and at least a front part of said protective sleeve (32) has an outside diameter which is substantially the same size as said enlarged inside diameter (21) of said outer sleeve (2).

7. An indicator element according to claim 2, wherein said flange (30) of said fitting (24) is disposed between said axial front end face (44) of said protective sleeve (32) and a rear end surface (27) of said cap (6).

8. An indicator element according to claim 2, wherein said light source is one of a glow discharge lamp (50) and a multiple light emitting diode (26) with at least four LED chips.

9. An indicator element according to claim 2, wherein the protective sleeve (36) is formed of plastic and is configured as a guard against electrical contact with said connecting conductors (28, 29).

10. An indicator element according to claim 2, wherein said protective sleeve (32) has openings (40, 41) in its bottom (38) for means for establishing electrical contact between said connecting conductors and a source of electrical energy.

11. An indicator element according to claim 2, further wherein said fitting (24) is configured as a plastic reflector which extends at least partially into the cap (6).

12. An indicator element according to claim 11, wherein said fitting (24) has a cup-like configuration with a forwardly open conical reflective inside surface (10) and a bottom through which the light source (26, 50) or the connecting conductors (28, 29) extend carried into the interior (34) of said protective sleeve (32).

13. An indicator element according to claim 2, wherein said fitting is formed by a rear end portion of said cap.

14. An indicator element according to claim 13, wherein said protective sleeve (32) lies with said axial front end face (44) directly axially abutting a rear end surface (27) of the cap (6).

15. An indicator element comprising a light permeable cap (6), a light source (26, 50) arranged to direct light through said cap, a protective sleeve (32) axially arranged with respect to said cap in an inner chamber of which connecting conductors (54, 55) for said light source (26, 50) extend, an outer sleeve (2) at least partially surrounding said cap (6) and said protective sleeve (32), said cap (6) and said protective sleeve (32) being fastened in said outer sleeve (2), wherein said cap is provided with a rearwardly extending annular axial extension (57), and the front end of said protective sleeve (32) is provided with a mating recess (58) in which said extension is received in overlapping relation with the front end of the protective sleeve.

* * * * *